(12) United States Patent
Chu et al.

(10) Patent No.: US 9,793,339 B2
(45) Date of Patent: Oct. 17, 2017

(54) METHOD FOR PREVENTING COPPER CONTAMINATION IN METAL-INSULATOR-METAL (MIM) CAPACITORS

(71) Applicant: Taiwan Semiconductor Manufacturing Co., Ltd., Hsin-Chu (TW)

(72) Inventors: Ching-Sheng Chu, Baoshan Township (TW); Chern-Yow Hsu, Chu-Bei (TW); Shih-Chang Liu, Alian Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/591,981

(22) Filed: Jan. 8, 2015

(65) Prior Publication Data

US 2016/0204190 A1    Jul. 14, 2016

(51) Int. Cl.
| | |
|---|---|
| H01L 21/02 | (2006.01) |
| H01L 21/20 | (2006.01) |
| H01L 49/02 | (2006.01) |
| H01L 21/762 | (2006.01) |
| H01L 21/768 | (2006.01) |
| H01L 23/522 | (2006.01) |
| H01L 23/532 | (2006.01) |

(52) U.S. Cl.
CPC ........ *H01L 28/75* (2013.01); *H01L 21/76224* (2013.01); *H01L 21/76877* (2013.01); *H01L 23/5223* (2013.01); *H01L 23/5226* (2013.01); *H01L 23/53223* (2013.01); *H01L 23/53238* (2013.01); *H01L 23/53266* (2013.01); *H01L 2924/0002* (2013.01)

(58) Field of Classification Search
CPC .................................................. H01L 23/5223
USPC .......................................... 257/532; 438/393
See application file for complete search history.

(56) References Cited

U.S. PATENT DOCUMENTS

| | | |
|---|---|---|
| 6,114,051 A | 9/2000 | Timmer et al. |
| 6,303,427 B1 | 10/2001 | Song et al. |

(Continued)

OTHER PUBLICATIONS

Notice of Allowance Dated Oct. 5, 2015 U.S. Appl. No. 14/450,532.

(Continued)

*Primary Examiner* — Matthew Landau
*Assistant Examiner* — Igwe U Anya
(74) *Attorney, Agent, or Firm* — Eschweiler & Potashnik, LLC

(57) ABSTRACT

The present disclosure relates to a MIM capacitor that includes a composite capacitor top metal (CTM) electrode and a composite capacitor bottom metal (CBM) electrode. The composite CBM electrode includes a first diffusion barrier layer overlying a first metal layer, and the composite CTM electrode includes a second diffusion barrier layer overlying a second metal layer. A dielectric layer is arranged over the composite CBM electrode, underlying the composite CTM electrode. The first and second diffusion barrier layers protect the first and second metal layers from metal that diffuses or moves from a metal line underlying the MIM capacitor to the composite CTM and CBM electrodes during manufacture. A method of manufacturing the MIM capacitor is also provided.

19 Claims, 7 Drawing Sheets

(56) References Cited

U.S. PATENT DOCUMENTS

| | | | | |
|---|---|---|---|---|
| 6,334,964 B1* | 1/2002 | Cowman | | H01C 7/1006 |
| | | | | 106/1.16 |
| 6,759,703 B1* | 7/2004 | Matsuhashi | | H01L 28/75 |
| | | | | 257/306 |
| 6,812,088 B1 | 11/2004 | Chen et al. | | |
| 6,821,839 B2 | 11/2004 | Chung | | |
| 6,972,265 B1* | 12/2005 | Schwarz | | H01L 21/32136 |
| | | | | 257/E21.311 |
| 7,078,785 B2 | 7/2006 | Ciancio et al. | | |
| 7,301,752 B2* | 11/2007 | Coolbaugh | | H01L 23/5223 |
| | | | | 257/295 |
| 7,335,569 B2 | 2/2008 | Senzaki | | |
| 9,257,498 B1* | 2/2016 | Hsu | | H01L 28/60 |
| 2001/0014510 A1 | 8/2001 | Park | | |
| 2002/0071237 A1 | 6/2002 | Adler | | |
| 2003/0011014 A1 | 1/2003 | Basceri et al. | | |
| 2004/0084701 A1* | 5/2004 | Kanaya | | H01L 27/11502 |
| | | | | 257/295 |
| 2004/0169211 A1 | 9/2004 | Zhuang et al. | | |
| 2004/0222493 A1 | 11/2004 | Sato et al. | | |
| 2005/0062130 A1* | 3/2005 | Ciancio | | H01L 23/5223 |
| | | | | 257/532 |
| 2006/0145293 A1* | 7/2006 | Cho | | H01L 23/5223 |
| | | | | 257/532 |
| 2006/0183280 A1* | 8/2006 | Lee | | H01L 21/76807 |
| | | | | 438/239 |
| 2006/0197183 A1* | 9/2006 | Yang | | H01L 21/76834 |
| | | | | 257/532 |
| 2006/0292815 A1* | 12/2006 | Roberts | | H01L 21/02123 |
| | | | | 438/393 |
| 2007/0034924 A1* | 2/2007 | Takewaki | | H01L 23/5223 |
| | | | | 257/296 |
| 2008/0318378 A1 | 12/2008 | Wu et al. | | |
| 2009/0014835 A1* | 1/2009 | Furumiya | | H01L 28/40 |
| | | | | 257/535 |
| 2009/0246971 A1 | 10/2009 | Reid et al. | | |
| 2009/0267187 A1* | 10/2009 | Hose | | H01L 28/75 |
| | | | | 257/535 |
| 2011/0108951 A1* | 5/2011 | Cho | | H01L 21/31144 |
| | | | | 257/532 |
| 2011/0227195 A1* | 9/2011 | Horng | | H01L 23/5223 |
| | | | | 257/532 |
| 2014/0264751 A1* | 9/2014 | Chen | | H01L 27/016 |
| | | | | 257/533 |
| 2015/0072441 A1* | 3/2015 | Sun | | H01L 28/55 |
| | | | | 438/3 |

OTHER PUBLICATIONS

U.S. Appl. No. 14/230,204, filed Mar. 31, 2014.
U.S. Appl. No. 14/450,532, filed Aug. 4, 2014.
Yang-Kyu Choi, et al.; "Investigation of Gate-Induced Drain Leakage (GIDL) Current in Thin Body Devices: Single-Gate Ultra-Thin Body, Symmetrical Double-Gate, and Asymmetrical Double-Gate MOSFETs"; Jpn. J. Appl. Phys. vol. 42 (2003), p. 2073-2076.
Deok-Sin Kil, et al., "Improvement of Leakage Current Property of TIT Capacitor with Compositionally Stepped $Hf_xAl_yO_z$ Thin Films," Electronic Materials Letters, vol. 2, No. 1, p. 15-18, 2006.
Non-Final Office Action dated Jul. 1, 2015 for U.S. Appl. No. 14/450,532.
Final Office Action Dated Apr. 21, 2016 U.S. Appl. No. 14/230,204.
Non Final Office Action Dated Dec. 4, 2015 U.S. Appl. No. 14/230,204.
Final Office Action dated Aug. 17, 2017 U.S. Appl. No. 14/230,204.

* cited by examiner

METHOD FOR PREVENTING COPPER CONTAMINATION IN METAL-INSULATOR-METAL (MIM) CAPACITORS

BACKGROUND

A capacitor is a passive two-terminal electrical device used to store energy within an electric field, and contains at least two electrodes separated by a dielectric region. The capacitance of a capacitor is proportional to the surface area of the electrodes, and inversely proportional to the thickness of the dielectric region. Some examples of capacitors include deep trench (DT) capacitors and metal-insulator-metal (MIM) capacitors. DT capacitors are formed directly within a substrate, whereas MIM capacitors are formed within a back end of line (BEOL) metallization stack.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
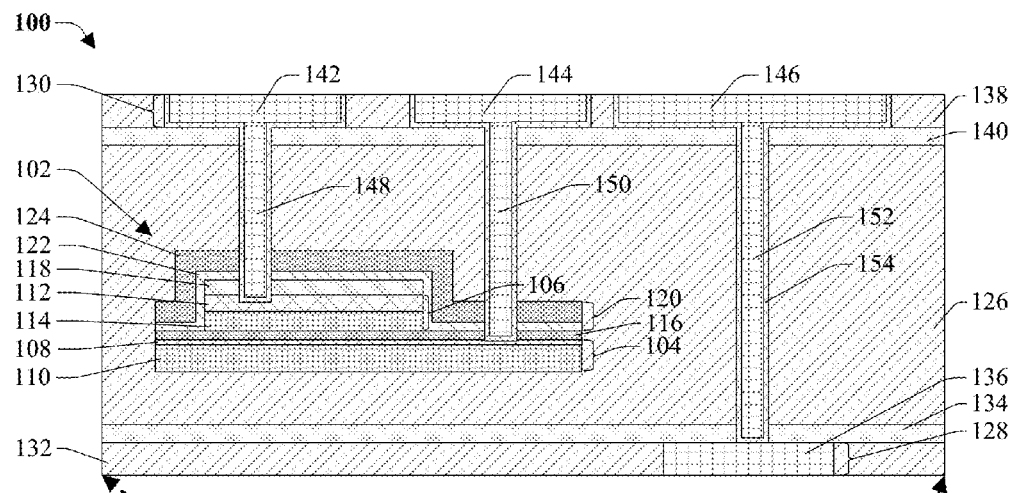
FIG. 1 illustrates a cross-sectional view of some embodiments of a semiconductor structure having a metal-insulator-metal (MIM) capacitor with composite top and bottom electrodes.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

A MIM capacitor has a top metal electrode and a bottom metal electrode separated by a capacitor dielectric layer. One type of MIM capacitor is a high density decoupling MIM capacitor (HD decap MIM). High density decoupling MIM capacitors typically have a capacitance density exceeding 10 femtofarads per square micrometer ($fF/\mu m2$), and are typically used to filter out or reduce noise from the power supplies of integrated circuits. Further, high density decoupling MIM capacitors are typically formed within the back end of line (BEOL) metallization stacks of integrated circuits.

According to some methods, a MIM capacitor is formed in or over a BEOL metallization stack which includes a first metallization layer in electrical communication with a logic area of the integrated circuit. A first interlayer dielectric (ILD) layer is arranged over the first metallization layer, and the MIM capacitor is formed over the first ILD layer. In particular, the MIM capacitor includes a capacitor bottom metal electrode (CBM) electrode, a capacitor dielectric over the CBM electrode, and a capacitor top metal (CTM) electrode over the capacitor dielectric. A second ILD layer is formed over the CTM electrode. To form vias to the CBM electrode, CTM electrode, and underlying first metallization layer, an etch can be used to form vertical openings which extend through the second ILD layer to concurrently expose upper portions of the CBM electrode, CTM electrode, and first metallization layer. These vertical openings are then lined with a barrier layer, and concurrently filled with a conductive material to form vias that electrically contact the CBM electrode, CTM electrode, and first metallization layer.

A challenge with forming a MIM capacitor as described above is that the etch used to form via openings can, in some instances, cause metal species (e.g., copper) to be ejected from the first metallization layer and to be deposited on the CBM and/or CTM electrode, due to the fact that these openings are open concurrently. If these metal species are deposited on the CBM and/or CTM electrode (and/or diffuse into the CBM and/or CTM electrode and/or capacitor dielectric), it can increase leakage current of the MIM capacitor and lower the breakdown voltage of the MIM capacitor. This negatively impacts the performance of the MIM capacitor and can lead to early failure.

In view of the foregoing, the present application is directed to a MIM capacitor having composite CTM and CBM electrodes with diffusion barrier layers protecting underlying metal layers from the metal of the first metallization layer. The via openings corresponding to the CTM and CBM electrodes extend to points within the diffusion barrier layers that are spaced from the underlying metal layers. Hence, if metal of the first metallization layer is ejected from the first metallization layer while the via openings for the CBM and CTM electrodes are left open, the metal is prevented from reaching the underlying metal layers by the diffusion barrier layers. Advantageously, by preventing the metal from the first metallization layer from reaching the underlying metal layers of the CBM and CTM electrodes, the impact of the metal on the leakage current and the breakdown voltage of the MIM capacitor is reduced.

FIG. 1 illustrates a cross-sectional view 100 of some embodiments of a semiconductor structure of a BEOL metallization stack. The semiconductor structure includes a metal-insulator-metal (MIM) capacitor 102. The MIM capacitor 102 includes a composite capacitor bottom metal (CBM) electrode 104 and a composite capacitor top metal (CTM) electrode 106. The composite CBM electrode 104 is arranged under the composite CTM electrode 106, and has a larger footprint than composite CTM electrode 106. The composite CBM electrode 104 comprises a first diffusion barrier layer 108 arranged over a bottom metal layer 110. Similarly, the composite CTM electrode 106 comprises a second diffusion barrier layer 112 arranged over a top metal layer 114. The first and second diffusion barrier layers 108, 112 may be, for example, an amorphous metal, such as tantalum nitride, niobium nitride, etc. The top and bottom metal layers 110, 114 may be, for example, titanium or titanium nitride.

A capacitor dielectric layer 116 of the MIM capacitor 102 is arranged between the composite CTM and CBM electrodes 104, 106, and typically shares the footprint of the composite CBM electrode 104. The capacitor dielectric layer 116 is configured to electrically insulate the composite CBM electrode 104 from the composite CTM electrode 106. By electrically insulating the composite CBM electrode 104 from the composite CTM electrode 106, the MIM capacitor 102 is able to store energy in an electric field generated between the composite CBM electrode 104 and the composite CTM electrode 106. In some embodiments, the capacitor dielectric layer 116 may comprise a high-κ dielectric material (i.e., a dielectric material having a dielectric constant κ greater than silicon dioxide). Advantageously, this allows high capacitance density (e.g., a capacitance density exceeding 10 fF/μm2).

A top electrode hard mask 118 of the MIM capacitor 102 is arranged over the composite CTM electrode 106, and a bottom electrode hard mask 120 of the MIM capacitor 102 is arranged over the capacitor dielectric layer 116 and the top electrode hard mask 118. The top electrode hard mask 118 typically shares the footprint of the composite CTM electrode 106 and, in some embodiments, has a thickness of about 250-500 Angstroms. The top electrode hard mask 118 may be, for example, silicon oxynitride. The bottom electrode hard mask 120 lines the top electrode hard mask 118 and the composite CTM electrode 106. Further, the bottom electrode hard mask 120 typically shares the footprint of the composite CBM electrode 104 and, in some embodiments, has a thickness of about 600-1200 Angstroms. The bottom electrode hard mask 120 comprises a capping layer 122 underlying a first etch stop layer 124. The capping layer 122 may be, for example, silicon dioxide, and the first etch stop layer 124 may be, for example, silicon nitride.

The MIM capacitor 102 is arranged within a first ILD layer 126 between a first metallization layer 128 and a second metallization layer 130. The first metallization layer 128 is arranged within a second ILD layer 132 and underlies a second etch stop layer 134 arranged between the first and second ILD layers 126, 132. The first metallization layer 128 includes a first metal line 136 electrically coupled to a logic area of an underlying device layer (not shown). The second metallization layer 130 is arranged within a third ILD layer 138 and overlies a third etch stop layer 140 arranged between the first and third ILD layers 126, 138. The second metallization layer 130 includes second metal lines 142, 144, 146, corresponding to the composite CTM and CBM electrodes 104, 106 and the first metal line 136. The second metal lines 142, 144 corresponding to the composite CTM and CBM electrodes 104, 106 typically have different sizes (e.g., heights and/or widths) than the second metal line 146 corresponding to the first metal line 136. Further, the second metal lines 142, 144, 146 typically have larger sizes (e.g., heights and/or widths) than the first metal line 136 and other underlying metal lines. The first, second, and third ILD layers 126, 132, 138 may be, for example, a low κ dielectric (i.e., a dielectric with a dielectric constant κ less than 3.9), such as undoped silicate glass. The first and second metallization layers 128, 130 may be, for example, a metal, such as copper or tungsten.

A first via 148, a second via 150, and a third via 152 extend from the second metal lines 142, 144, 146 respectively to the first diffusion barrier layer 108, the second diffusion barrier layer 112, and the first metal line 136. The first and second vias 148, 150 extend to points within the first and second diffusion barrier layers 108, 112 spaced from the top and bottom metal layers 110, 114. The first and second vias 148, 150 are respectively configured to electrically couple the second metallization layer 130 to the composite CTM and CBM electrodes 104, 106. The third metal via 152 extends to a top surface of the first metal line 136, and is configured to electrically couple the second metallization layer 130 to the first metallization layer 128. The first, second, and third vias 148, 150, 152 may be, for example, a metal, such as copper or tungsten.

A third diffusion barrier layer 154 lines the first, second, and third vias 148, 150, 152 and the second metallization layer 130. The third diffusion barrier layer 154 serves as a barrier to prevent the diffusion of materials into the MIM capacitor 102 and the first metallization layer 128 during the formation of the first, second, and third vias 148, 150, 152 and the second metallization layer 130. The third diffusion barrier layer 154 may be, for example, tantalum nitride or other group-V nitrides.

As will be appreciated in greater detail below, the first diffusion barrier layer 108 and the second diffusion barrier layer 112 prevent the movement or diffusion of metal, such as copper, from the first metallization layer 128 to the top and bottom metal layers 110, 114 during the formation of the MIM capacitor 102. This advantageously prevents the negative impacts commonly associated with the movement or diffusion of metal to the top and bottom metal layers 110, 114, such as increased leakage current and reduced break down voltage.

Figure 2:
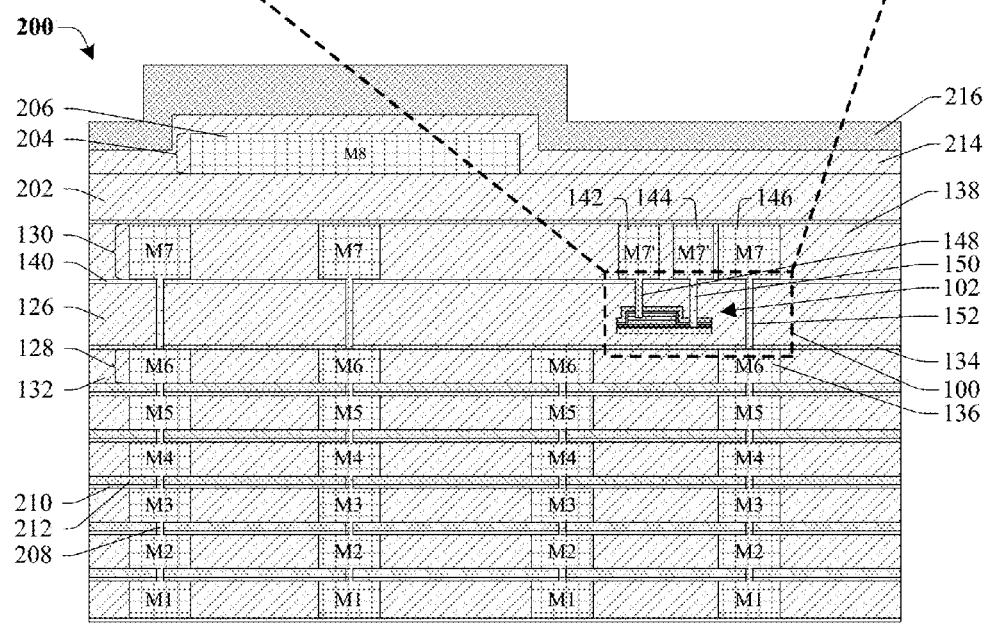
FIG. 2 illustrates a cross-sectional view of some embodiments of a back end of line (BEOL) metallization stack including a MIM capacitor with composite top and bottom electrodes.

FIG. 2 illustrates a cross-sectional view 200 of some embodiments of a BEOL metallization stack of an integrated circuit. The BEOL metallization stack includes a MIM capacitor 102 with composite CTM and CBM electrodes. Further, the BEOL metallization stack includes a plurality of ILD layers 126, 132, 138, 202 and a plurality of metallization layers 128, 130, 204 stacked over and within the ILD layers 126, 132, 138, 202. The ILD layers 126, 132, 138, 202 may be, for example, a low κ dielectric, such as undoped silicate glass. The metallization layers 128, 130, 204 may be, for example, copper or aluminum.

The metallization layers 128, 130, 204 include a redistribution metallization layer 204 and a plurality of layers 128, 130 underlying the redistribution metallization layer 204. The redistribution metallization layer 204 and the underlying metallization layers 128, 130 include metal features 136, 142, 144, 146, 206 (also labeled as M1-M8 and M7'). For the redistribution metallization layer 204, the metal features 206 correspond to bond pads 206, and for the underlying metallization layers 128, 130, the metal features 136, 142, 144, 146 correspond to metal lines. In some embodiments, the metal features 136, 142, 144, 146, 206 have different sizes (e.g., widths and/or heights) within a metallization layer 128, 130, 204 and/or between metallization layers 128, 130, 204. For example, the underlying metallization layer 130 neighboring the redistribution metallization layer 204 typically has larger metal feature sizes than the other underlying metallization layers 128 so as to withstand the thermal stresses induced during manufacture. As another example, the underlying metallization layer 130 neighboring the redistribution metallization layer 204 typically has different feature sizes between metal features 142, 144 corresponding to the MIM capacitor 102 and metal features 146 that are not associated with the MIM capacitor.

Vias 148, 150, 152, 208 extend between neighboring metallization layers 128, 130, 204, and between the metallization layers 128, 130, 204 and a device layer (not shown) underlying the BEOL metallization stack. The vias 148, 150, 152, 208 extend through etch stop layers 134, 140, 210 and isolation layers 212 arranged between the ILD layers 126, 132, 138, 202 and the metallization layers 128, 130, 204. In some embodiments, an etch stop layer 134, 140, 210 and an isolation layer 212 overlying the etch stop layer 134, 140, 210 are arranged between each pair of neighboring metallization layers 128, 130, 204 underlying the MIM capacitor 102. The etch stop layers 134, 140, 210 may be, for example, silicon nitride, and the isolation layers 212 may be, for example, a dielectric, such as silicon dioxide. The vias 148, 150, 152, 208 may be, for example, a metal, such as copper or tungsten.

A low κ dielectric layer 214 is arranged over the redistribution metallization layer 204 and the ILD layers 126, 132, 138, 202, and a passivation layer 216 is arranged over the low κ dielectric layer 214. Typically, the low κ dielectric layer 214 and the passivation layer 216 are conformal. The low κ dielectric layer 214 and the passivation layer 216 protect the redistribution metallization layer 204 and the integrated circuit from the environment, including dust and electrostatic discharge. The low κ dielectric layer 214 may be, for example, undoped silicate glass, and the passivation layer 216 may be, for example, silicon nitride.

Figure 3:
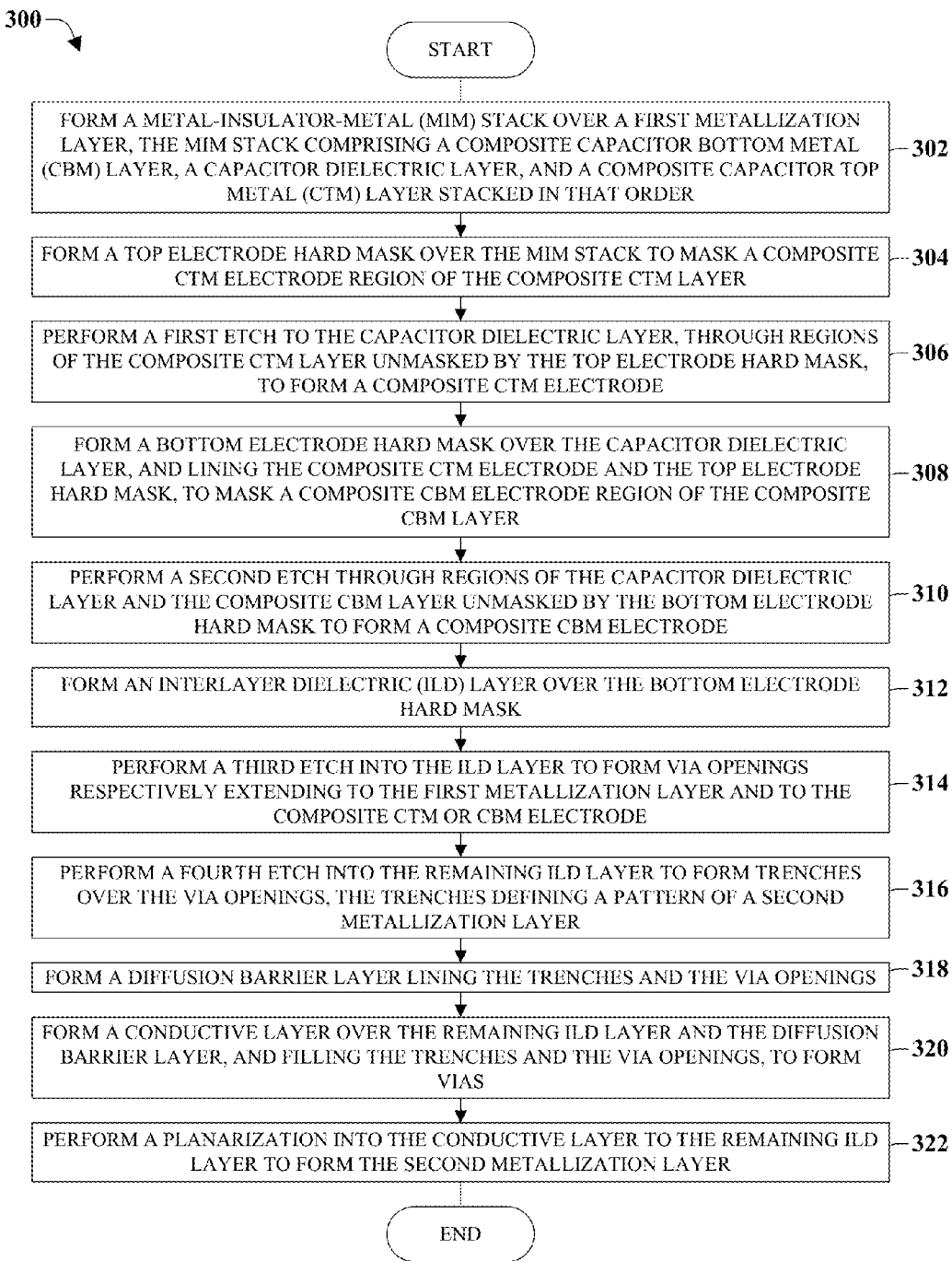
FIG. 3 illustrates a flowchart of some embodiments of a method for manufacturing a semiconductor structure having a MIM capacitor with composite top and bottom electrodes.

FIG. 3 illustrates a flowchart 300 of some embodiments of a method for manufacturing a semiconductor structure having a MIM capacitor with composite top and bottom electrodes. While the disclosed method is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 302, a MIM stack is formed over a first metallization layer. The MIM stack includes a composite CBM layer, a capacitor dielectric layer, and a composite CTM layer stacked in that order. The composite CBM and CTM layers include first and second diffusion barrier layers overlying top and bottom metal layers.

At 304, a top electrode hard mask is formed over the MIM stack, to mask a composite CTM electrode region of the composite CTM layer.

At 306, a first etch is performed to the capacitor dielectric layer, through regions of the composite CTM layer unmasked by the top electrode hard mask, to form a composite CTM electrode.

At 308, a bottom electrode hard mask is formed over the capacitor dielectric layer, and lining the composite CTM electrode and the top electrode hard mask, to mask a composite CBM electrode region of the composite CBM layer.

At 310, a second etch is performed through regions of the capacitor dielectric layer and the composite CBM layer unmasked by the bottom electrode hard mask to form a composite CBM electrode.

At 312, a ILD layer is formed over the bottom electrode hard mask.

At 314, a third etch is performed into the ILD layer to form via openings respectively extending to the first metallization layer and to the composite CTM or CBM electrode.

At 316, a fourth etch is performed into the remaining ILD layer to form trenches over the via openings, where the trenches define a pattern of a second metallization layer.

At 318, a third diffusion barrier layer lining the trenches and the via openings is formed.

At 320, a conductive layer is formed over the remaining ILD layer and the third diffusion barrier layer, and filling the trenches and the via openings, to form vias.

At 322, a planarization is performed into the conductive layer, to the remaining ILD layer, to form the second metallization layer.

Advantageously, the first and second diffusion barrier layers of the composite CTM and CBM electrodes protect the composite CTM and CBM electrodes during the period intermediate Acts 316 and 318. As described above, during this period, metal can diffuse or otherwise move from the first metallization layer to the composite CTM and CBM electrodes. In such instances, the first and second diffusion barrier layers of the composite CTM and CBM electrodes protect the underlying top and bottom metal layers from the metal. Absent such protection, the resulting MIM capacitor could have increased leakage current and/or reduced breakdown voltage.

With reference to FIGS. 4-12, cross-sectional views of some embodiments of a semiconductor structure at various stages of manufacture are provided to illustrate the method of FIG. 3. Although FIGS. 4-12 are described in relation to the method, it will be appreciated that the structures disclosed in FIGS. 4-12 are not limited to the method, but instead may stand alone as structures independent of the method. Similarly, although the method is described in relation to FIGS. 4-12, it will be appreciated that the method is not limited to the structures disclosed in FIGS. 4-12, but instead may stand alone independent of the structures disclosed in FIGS. 4-12.

Figure 4:
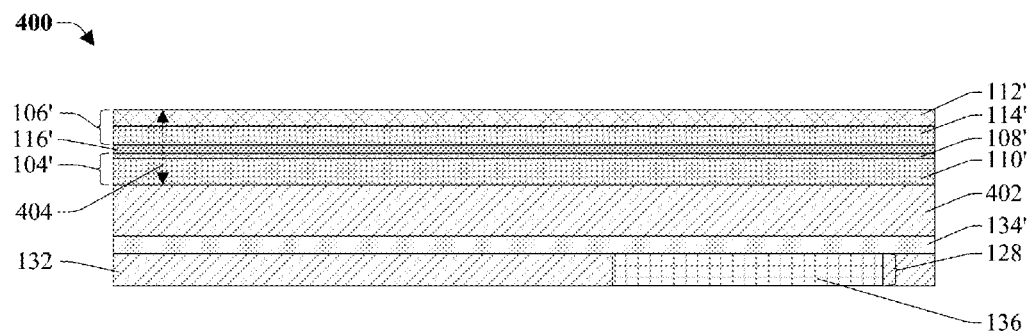
FIGS. 4-12 illustrate a series of cross-sectional views of some embodiments of a semiconductor structure at various stages of manufacturing, the semiconductor structure having a MIM capacitor with composite top and bottom electrodes.

FIG. 4 illustrates a cross-sectional view 400 of some embodiments of a semiconductor structure corresponding to Act 302 of FIG. 3.

As illustrated by FIG. 4, a first ILD layer 132 and a second ILD layer 402 are provided. The first ILD layer 132 includes a first metallization layer 128 arranged therein and underlies the second ILD layer 402. The first metallization layer 128 includes a first metal line 136, typically electrically coupled to a logic region. The first and second ILD layers 132, 402 are spaced with a first etch stop layer 134' arranged between the first and second ILD layers 132, 402. In some embodiments, a thickness of the first etch stop layer 134' ranges from approximately 450-900 Angstroms. The first and second ILD layers 132, 402 may be, for example, silicon dioxide, and the first etch stop layer 134' may be, for example, silicon carbide.

Also illustrated by FIG. 4, a MIM stack 404 is formed over the first and second ILD layers 132, 402. The MIM stack 404 includes a composite CBM layer 104', a capacitor dielectric layer 116', and a composite CTM layer 106' stacked in that order. In some embodiments, the composite CBM layer 104' and the composite CTM layer 106' are formed by a physical vapor deposition (PVD), a chemical vapor deposition (CVD), or other suitable layer growth process.

The composite CBM layer 104' comprises a first diffusion barrier layer 108' overlying a bottom metal layer 110', and the composite CTM layer 106' comprises a second diffusion barrier layer 112' overlying a top metal layer 114'. Thicknesses of the top and bottom metal layers 110', 114' may range from, for example, approximately 400-800 Angstroms. Further, the bottom metal layer 110' and the top metal layer 114' may be formed, for example, from a material with a metallic component (e.g., aluminum, copper, tantalum, titanium, and/or tungsten), such as titanium nitride. Thicknesses of the first and second diffusion barrier layers 108', 112' may range, for example, from approximately 50-200 Angstroms. Further, the first and second diffusion barrier layers 108', 112' may be, for example, tantalum and/or niobium.

The capacitor dielectric layer 116' comprises a high κ dielectric, such as, for example, aluminum oxide, hafnium oxide, silicon dioxide, silicon carbide, silicon nitride (SiN or $Si_3N_4$), tantalum pentoxide ($Ta_2O_5$), tantalum oxynitride (TaON), tantalum dioxide ($TiO_2$), zirconium dioxide ($ZrO_2$), tetraethosiloxane (TEOS), spin-on-glass (SOG), halogenated silicon oxide, fluorinated silicate glass (FSG), and the like. In some embodiments, a thickness of the capacitor dielectric layer 116' ranges from, for example, approximately 50-150 Angstroms.

Figure 5:
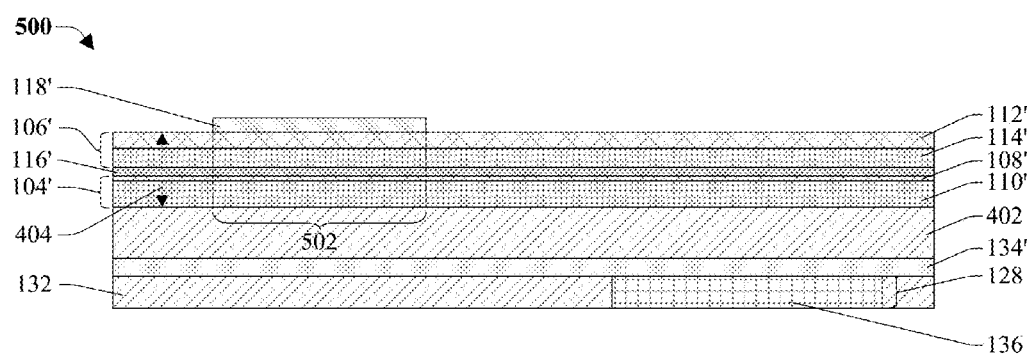

FIG. 5 illustrates a cross-sectional view 500 of a semiconductor structure corresponding to Act 304 of FIG. 3. As illustrated, a top electrode hard mask 118' is formed over the MIM stack 404 to mask a composite CTM electrode region 502 of the MIM stack 404. The top electrode hard mask 118' may be, for example, a protective silicon oxy-nitride (PE-SiON) layer deposited by a plasma enhanced CVD technique. In some embodiments, the process for forming the top electrode hard mask 118' includes forming a hard mask layer over the MIM stack 404 and performing an etch to the MIM stack 404 through regions of the hard mask layer surrounding the composite CTM electrode region 502.

Figure 6:
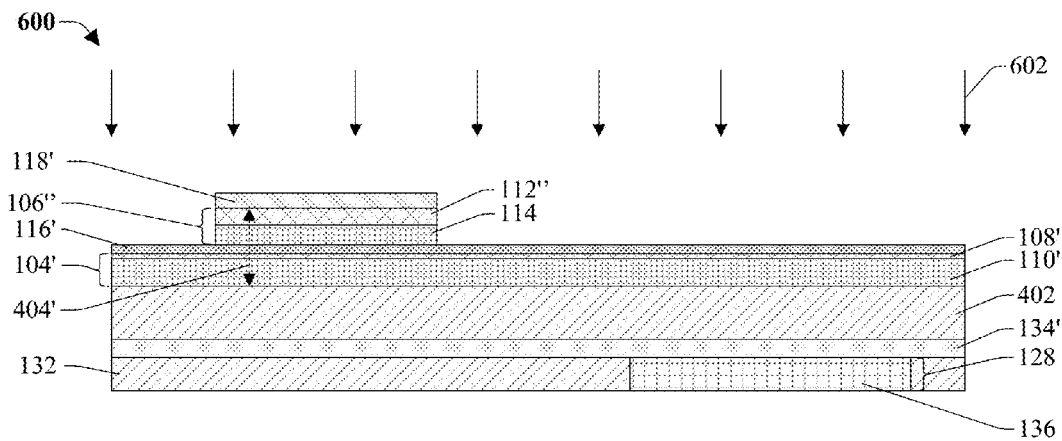

FIG. 6 illustrates a cross-sectional view 600 of a semiconductor structure corresponding to Act 306 of FIG. 3. As illustrated, a first etch is performed to the capacitor dielectric layer 116' through regions of the composite CTM layer 106' unmasked by the top electrode hard mask 118' by exposing the unmasked regions to an etchant 602. In some embodiments, the etchant 602 may comprise a dry etchant (e.g., a plasma etchant, an RIE etchant, etc.) or a wet etchant (e.g., hydrofluoric acid). The first etch defines a composite CTM electrode 106" by removing the unmasked regions of the composite CTM layer 106'. The composite CTM electrode 106" includes the remaining top metal layer 114 and the remaining second diffusion barrier layer 112".

Figure 7:
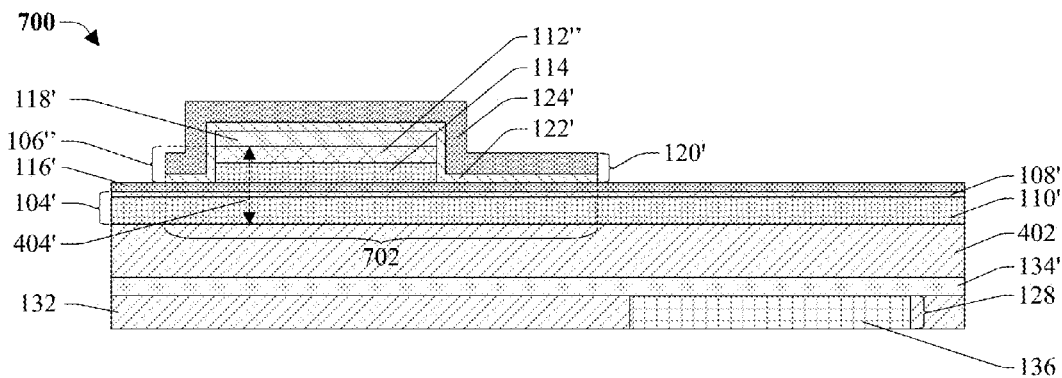

FIG. 7 illustrates a cross-sectional view 700 of a semiconductor structure corresponding to Act 308 of FIG. 3. As illustrated, a bottom electrode hard mask 120' is formed over a composite CBM electrode region 702 of the remaining MIM stack 404'. The bottom electrode hard mask 120' includes a capping layer 122' and a second etch stop layer 124' overlying the capping layer 122'. The capping layer 122' is formed over the capacitor dielectric layer 116', and lines the composite CTM electrode 106" and the top electrode hard mask 118'. The second etch stop layer 124' conformally overlies the capping layer 122', and is configured to prevent damage to a composite CTM electrode 106" during a subsequent processes. The capping layer 122' and the second etch stop layer 124' may be deposited by way of a vapor deposition process (e.g., PVD or CVD). The capping layer 122' may be, for example, an oxide, and the second etch stop layer 124' may be, for example, silicon nitride. In some embodiments, the process for forming the bottom electrode hard mask 120' includes: forming a hard mask layer over the capacitor dielectric layer 116', and lining the composite CTM electrode 106" and the top electrode hard mask 118'; and performing an etch to the capacitor dielectric layer 116' through regions of the hard mask layer surrounding the composite CBM electrode region 702.

Figure 8:
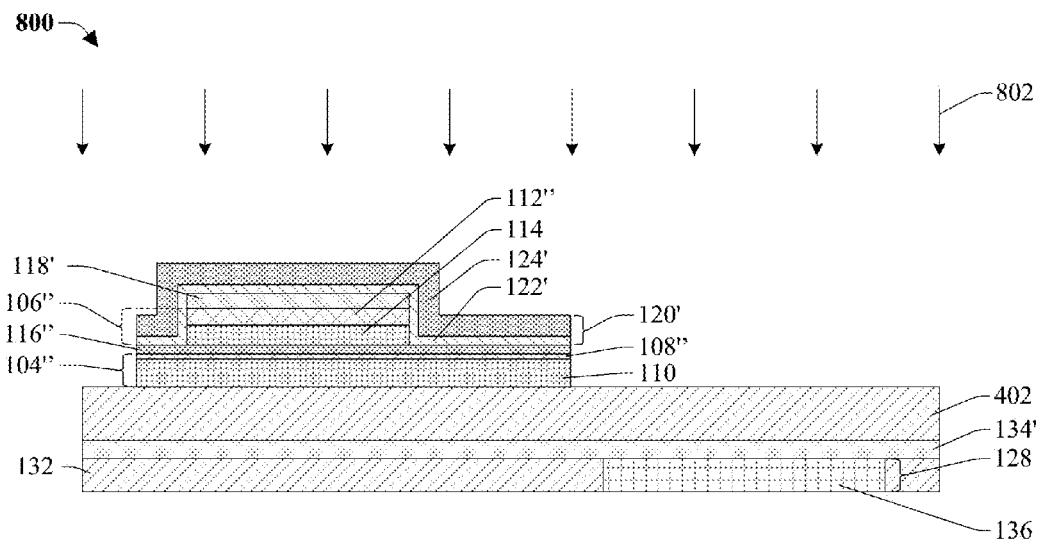

FIG. 8 illustrates a cross-sectional view 800 of a semiconductor structure corresponding to Act 310 of FIG. 3. As illustrated, a second etch is performed to the second ILD layer 402 through regions of the capacitor dielectric layer 116' and the composite CBM layer 104' unmasked by the bottom electrode hard mask 120' by exposing the unmasked regions to an etchant 802. In some embodiments, the etchant 802 may comprise a dry etchant (e.g., a plasma etchant, an RIE etchant, etc.) or a wet etchant (e.g., hydrofluoric acid). The second etch defines a composite CBM electrode 104" by removing the unmasked regions of the capacitor dielectric layer 116' and the composite CBM layer 104'. The composite CBM electrode 104" includes the remaining bottom metal layer 110 and the remaining first diffusion barrier layer 108".

Figure 9:
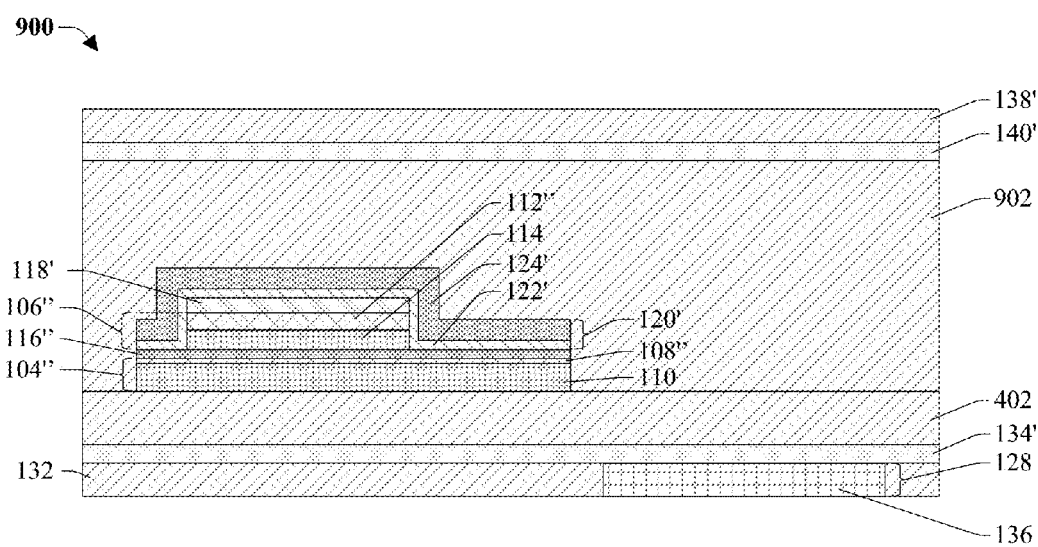

FIG. 9 illustrates a cross-sectional view 900 of a semiconductor structure corresponding to Act 312 of FIG. 3. As illustrated, a third ILD layer 902 is formed over the bottom electrode hard mask 120', the top electrode hard mask 118', the remaining first diffusion barrier, second diffusion barrier, top metal, bottom metal, and capacitor dielectric layers 108", 110, 112", 114, 116", and the second ILD layer 402. Also illustrated, a third etch stop layer 140' and a fourth ILD layer 138' are formed in that order over the third ILD layer 902. The third ILD layer 902 and the fourth ILD layer 138' may be, for example, silicon dioxide, and the third etch stop layer 140' may be, for example, silicon carbide.

Figure 10:
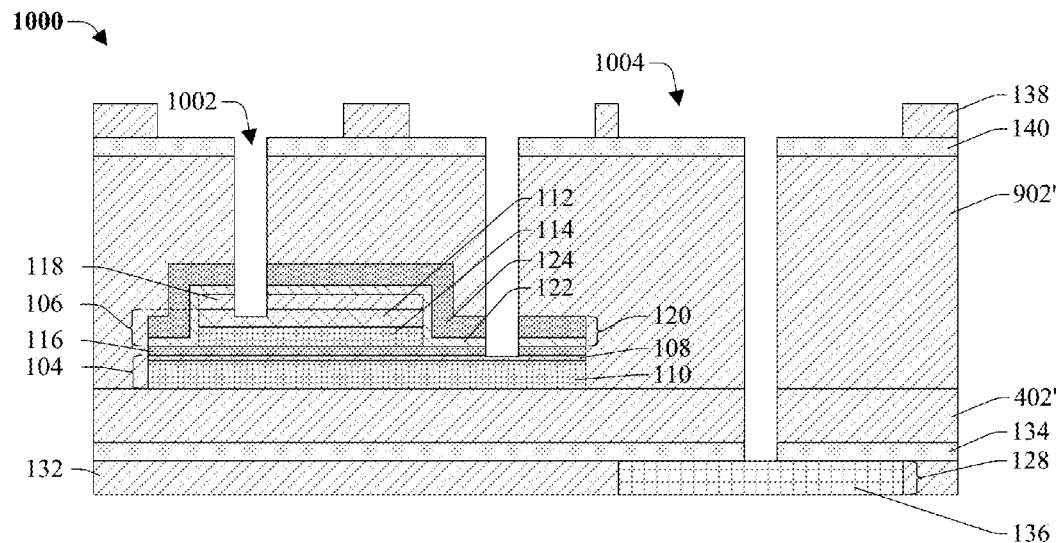

FIG. 10 illustrates a cross-sectional view 1000 of a semiconductor structure corresponding to Acts 314 and 316 of FIG. 3.

In FIG. 10 third and four etches are performed. The third etch defines via openings 1002 and the fourth etch defines trenches 1004, and can be performed in any order. The via openings 1002 respectively extend towards the first metallization layer 128, remaining composite CBM electrode 104, and the remaining composite CTM electrode 106. In particular, the third etch forms a CTM via opening extending through the second ILD layer 138/138', third etch stop layer 140', fourth ILD layer 902, bottom electrode hard mask 120', and top hard mask 118', and stops in the first diffusion barrier 112. The third etch also forms a CBM via opening extending through the second ILD layer 138/138', third etch stop layer 140', fourth ILD layer 902, bottom electrode hard mask 120', capacitor dielectric 116, and stops in the second diffusion barrier layer 108. The third etch also forms a first metallization via opening extending through the second ILD layer 138/138', third etch stop layer 140', fourth ILD layer 902, second ILD layer 402, and first etch stop layer 134, and stops on upper surface region of first metal line 136. The trenches 1004 define a pattern of a second metallization layer. The third and fourth etching may comprise dry etching (e.g., a plasma etchant, an RIE etchant, etc.) or wet etching (e.g., hydrofluoric acid as etchant).

In some embodiments, the via openings 1002 and the trenches 1004 are formed by one or more photolithography processes. For example, the process for forming the trenches 1004 may include coating the fourth ILD layer 138' with a photoresist layer, exposing the photoresist layer to radiation, and developing the photoresist layer to form a pattern within the photoresist layer. The pattern is then etched through the exposed portions of the photoresist layer to form the trenches 1004 in the fourth ILD layer 138'. In some embodiments, the pattern is etched anisotropically using known etching techniques, such as sputter etching, ion-beam etching, plasma etching, and the like. Other techniques can also be employed. After the etch, the photoresist layer is removed using conventional techniques, such as stripping or ashing.

Figure 11:
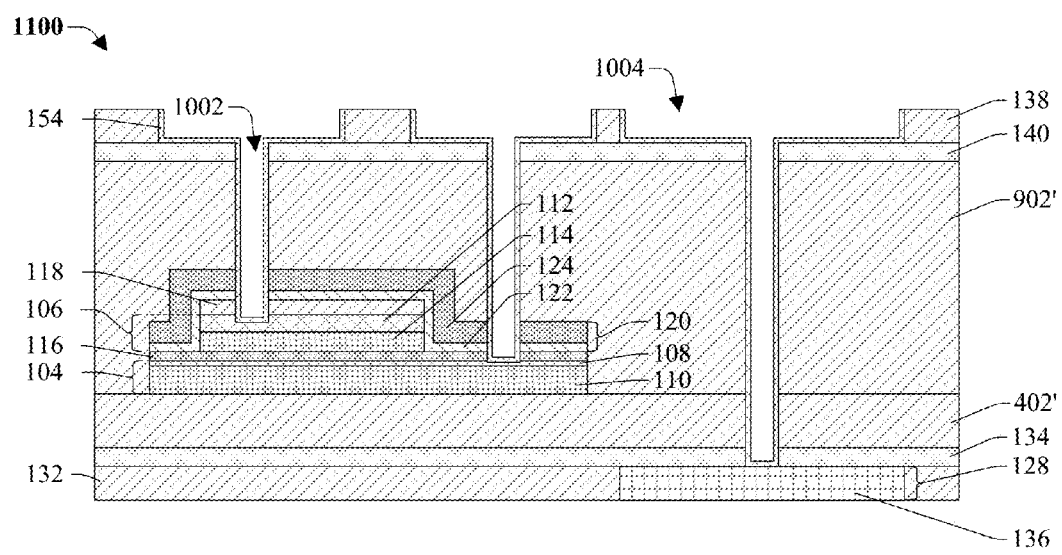

FIG. 11 illustrates a cross-sectional view 1100 of a semiconductor structure corresponding to Act 318 of FIG. 3. As illustrated, a third diffusion barrier layer 154 is formed lining the trenches 1004 and the via openings 1002 to prevent diffusion to the remaining composite CTM and CBM electrodes 104, 106. The third diffusion barrier layer 154 may be, for example, tantalum nitride.

Figure 12:
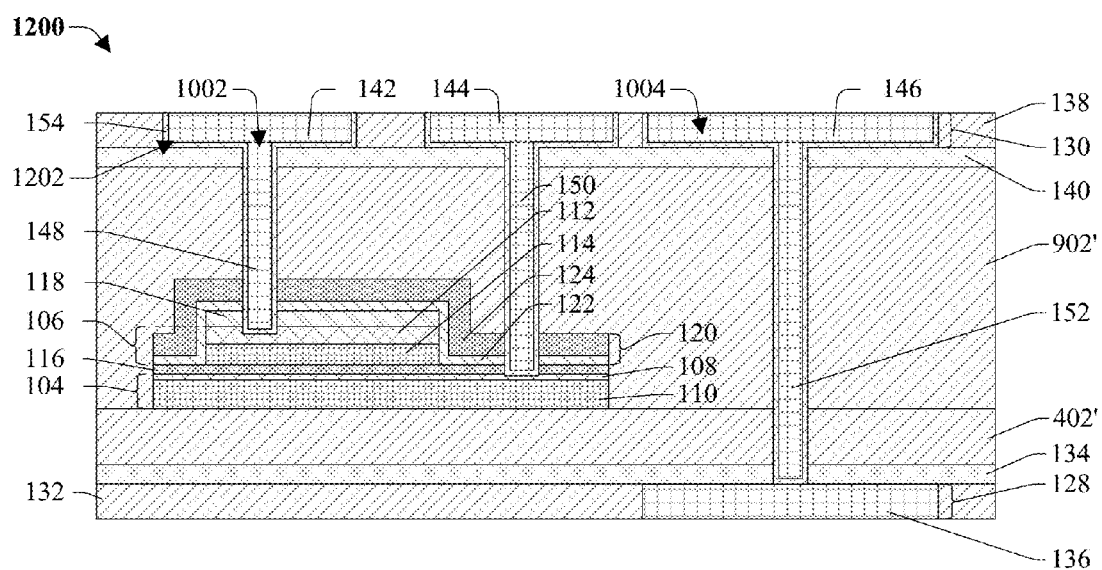

FIG. 12 illustrates a cross-sectional view 1200 of a semiconductor structure corresponding to Acts 320 and 322 of FIG. 3. As illustrated, a conductive layer 1202 is formed filling the trenches 1004 and the via openings 1002. The conductive layer 1202 defines a second metallization layer 130 and vias 148, 150, 152. The second metallization layer 130 includes second metal lines 142, 144, 146 corresponding to the remaining composite CBM electrode 104, the remaining composite CTM electrode 106, and the first metal line 136. The conductive layer 1202 may comprise a metal, such as copper, tungsten, or aluminum. In some embodiments, the process for forming the conductive layer 1202 includes: forming an initial conductive layer over the remaining fourth ILD layer 138 and the third diffusion barrier layer 154, and filling the trenches 1004 and the via openings 1002; and performing a planarization into the initial conductive layer to the remaining fourth ILD layer 138.

It is noted that the present disclosure presents embodiments in the form of a MIM capacitor, which may be included in a BEOL metallization stack of a manufactured integrated circuit, such as a microprocessor, memory device, and/or other integrated circuit. The integrated circuit may also include various passive and active microelectronic devices. For example, the integrated circuit may include one or more of: resistors; capacitors (e.g., deep trench capacitors); inductors; diodes; metal-oxide-semiconductor field effect transistors (MOSFETs); complementary metal-oxide-semiconductor (CMOS) transistors; bipolar junction transistors (BJTs); high power metal-oxide-semiconductor transistors, such as laterally diffused metal-oxide-semiconductor (LDMOS) transistors; and other types of transistors.

The integrated circuit is arranged on a substrate. The substrate may be, for example, a bulk silicon substrate or a semiconductor-on-insulator (SOI) substrate. Alternatively, the substrate may comprise: 1) another elementary semiconductor, such as germanium, for example; 2) a compound semiconductor including one or more of silicon carbide, gallium arsenic, gallium phosphide, indium phosphide, indium arsenide, and indium antimonide, for example; 3) an alloy semiconductor including one or more of silicon germanium, gallium arsenide phosphide, aluminum indium arsenide, aluminum gallium arsenide, gallium indium arsenide, gallium indium phosphide, and gallium indium arsenide phosphide, for example; or 4) a combination of the foregoing.

Thus, as can be appreciated from above, the present disclosure provides a semiconductor structure comprising a MIM capacitor. The MIM capacitor includes a composite CBM electrode with a first diffusion barrier layer overlying a first metal layer. Further, the MIM capacitor includes a dielectric layer arranged over the composite CBM electrode, and a composite CTM electrode arranged over the dielectric layer. The composite CTM electrode includes a second diffusion barrier layer overlying a second metal layer.

In other embodiments, the present disclosure provides a method of forming a semiconductor structure. A MIM capacitor is formed overlying a first metallization layer of a BEOL stack. The MIM capacitor includes a composite CTM electrode overlying a composite CBM electrode. The composite CBM and CTM electrodes include corresponding metal layers and corresponding diffusion barrier layers overlying the corresponding metal layers. A second metallization layer of the BEOL stack is formed over the MIM capacitor. A first via is formed extending from the second metallization layer into one of the diffusion barrier layers to a point within the one of the diffusion barrier layers that is spaced from the metal layers. A second via is formed laterally spaced from the MIM capacitor and extending between the first and second metallization layers.

In yet other embodiments, the present disclosure provides an integrated circuit comprising a MIM capacitor. The MIM capacitor includes a bottom electrode, a top electrode, and a dielectric layer arranged between the top and bottom electrodes. The top and bottom electrodes include corresponding metal layers and corresponding diffusion barrier layers overlying the corresponding metal layers. A BEOL stack includes a first metallization layer and a second metallization layer stacked on opposing sides of the MIM capacitor. A first via and a second via extend from the second metallization layer respectively into the diffusion barrier layers to points within the diffusion barrier layers that are spaced from the metal layers. A third via laterally spaced from the MIM capacitor extends between the first and second metallization layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising a metal-insulator-metal (MIM) capacitor, the MIM capacitor including:
   a composite capacitor bottom metal (CBM) electrode including a first diffusion barrier layer overlying a first metal layer;
   a dielectric layer arranged over the composite CBM electrode;

a composite capacitor top metal (CTM) electrode arranged over the dielectric layer and including a second diffusion barrier layer overlying a second metal layer;

a top electrode hard mask covering the composite CTM electrode;

a bottom electrode hard mask covering the composite CTM electrode and the dielectric layer, wherein the bottom electrode hard mask has a same footprint as the composite CBM electrode, wherein the bottom electrode hard mask conformally lines and contacts top surfaces respectively of the top electrode hard mask and the dielectric layer, and wherein the bottom electrode hard mask conformally lines and contacts sidewall surfaces of the top electrode hard mask and the composite CTM electrode; and a via extending to the first or second diffusion barrier layer, wherein the via extends through the bottom electrode hard mask to the first or second diffusion barrier layer.

2. The semiconductor structure of claim 1, wherein the via extends into the first or second diffusion barrier layer to a point within the first or second diffusion barrier layer that is spaced from the first and second metal layers, and wherein a bottom of the first or second diffusion barrier layer is flat from a first end of the first or second diffusion barrier layer to a second end of the first or second diffusion barrier layer that is opposite the first end.

3. The semiconductor structure of claim 2, wherein the via extends into the first diffusion barrier layer, and wherein the MIM capacitor further includes:

a second via extending into the second diffusion barrier layer to a point within the second diffusion barrier layer that is spaced from the first and second metal layers.

4. The semiconductor structure of claim 1, wherein the first and second metal layers include titanium (Ti) or titanium nitride (TiN), and wherein the first and second diffusion barrier layers include tantalum nitride (TaN) or niobium nitride (NbN).

5. The semiconductor structure of claim 1, further including:

an interlayer dielectric (ILD) layer surrounding the MIM capacitor;

a via opening extending through the ILD layer into the first or second diffusion barrier layer to a point within the first or second diffusion barrier layer that is spaced from the first and second metal layers; and a third diffusion barrier layer lining the via opening;

wherein the via fills the via opening over the third diffusion barrier layer.

6. The semiconductor structure according to claim 1, wherein the bottom electrode hard mask comprises a first hard mask layer conformally lining the top surfaces respectively of the top electrode hard mask and the dielectric layer, wherein the bottom electrode hard mask further comprises a second electrode hard mask layer covering and conformally lining the first hard mask layer, wherein the first hard mask layer is a different material than the second hard mask layer and the top electrode hard mask, and wherein the first and second hard mask layers share a footprint that is the same as a footprint of the composite CBM electrode.

7. The semiconductor structure according to claim 6, wherein the second metal layer has a bottom surface and a top surface respectively contacting the dielectric layer and the second diffusion barrier layer, wherein the second metal layer is continuous from the bottom surface of the second metal layer to the top surface of the second metal layer, and wherein the second diffusion barrier layer has a top surface contacting the top electrode hard mask.

8. The semiconductor structure according to claim 7, further comprising:

an interlayer dielectric (ILD) layer arranged vertically between the composite CBM electrode and a lower metallization layer, wherein a bottom surface of the ILD layer is spaced over the lower metallization layer;

wherein the first metal layer has a bottom surface and a top surface respectively contacting the ILD layer and the first diffusion barrier layer, wherein the first metal layer is continuous from the bottom surface of the first metal layer to the top surface of the first metal layer, and wherein the first diffusion barrier layer has a top surface contacting the dielectric layer.

9. The semiconductor structure according to claim 1, wherein the bottom electrode hard mask has a different material than the top electrode hard mask, wherein the bottom electrode hard mask extends continuously respectively from and to opposite sidewalls of the bottom electrode hard mask, and wherein the opposite sidewalls of the bottom electrode hard mask are respectively aligned with opposite sidewalls of the composite CBM electrode.

10. The semiconductor structure according to claim 1, wherein the second metal layer is a continuous material from an interface with the dielectric layer to an interface with the second diffusion barrier layer, and wherein the second diffusion barrier layer has a top surface contacting the top electrode hard mask.

11. An integrated circuit (IC) comprising:

a metal-insulator-metal (MIM) capacitor including a bottom electrode, a top electrode, and a dielectric layer arranged between the top and bottom electrodes, wherein the top and bottom electrodes include corresponding metal layers and corresponding diffusion barrier layers overlying the corresponding metal layers;

a back end of line (BEOL) stack including a lower metallization layer and an upper metallization layer respectively arranged under and over the MIM capacitor;

a first via and a second via extending from the upper metallization layer respectively into the diffusion barrier layers to points within the diffusion barrier layers that are spaced from the metal layers;

a third via laterally spaced from the MIM capacitor and extending from the upper metallization layer to the lower metallization layer; and an interlayer dielectric (ILD) layer arranged between the bottom electrode and the lower metallization layer, wherein the ILD layer comprises a bottom surface spaced over the lower metallization layer, wherein the MIM capacitor is confined over the ILD layer, and wherein the third via contacts the lower metallization layer at a location spaced below the bottom surface of the ILD layer.

12. The IC of claim 11, further comprising:

a top electrode hard mask arranged over the top electrode; and a bottom electrode hard mask conformally lining upper surfaces of the top electrode hard mask and the dielectric layer, and further conformally lining sidewall surfaces of the top electrode hard mask and the top electrode.

13. The IC according to claim 11, wherein the upper metallization layer comprises a first metal line and a second metal line from which the first via and the second via respectively extend, wherein the upper metallization layer further comprises a third metal line from which the third via extends, and wherein widths of the first and second metal lines are less than a width of the third metal line.

14. An integrated circuit (IC) comprising:
  a first metallization layer of a back end of line (BEOL) stack;
  an interlayer dielectric (ILD) layer covering the first metallization layer;
  a metal-insulator-metal (MIM) capacitor confined to over the ILD layer, the MIM capacitor including a composite capacitor bottom metal (CBM) electrode, a dielectric layer overlying the composite CBM electrode, and a composite capacitor top metal (CTM) electrode overlying the dielectric layer, wherein the composite CBM and CTM electrodes include corresponding metal layers and corresponding diffusion barrier layers overlying the corresponding metal layers, wherein the metal layer corresponding to the composite CBM electrode extends continuously from an interface with the ILD layer to an interface with the diffusion barrier layer corresponding to the composite CBM electrode, wherein the metal layer corresponding to the composite CTM electrode extends continuously from an interface with the dielectric layer to an interface with the diffusion barrier layer corresponding to the composite CTM electrode, and wherein the dielectric layer contacts the diffusion barrier layer corresponding to the composite CBM electrode and the metal layer corresponding to the composite CTM electrode;
  a second metallization layer of the BEOL stack over the MIM capacitor;
  a first via extending from the second metallization layer into one of the diffusion barrier layers to a point within the one of the diffusion barrier layers that is spaced from the metal layers; and
  a second via laterally spaced from the MIM capacitor and extending from the first metallization layer to the second metallization layer.

15. The IC of claim 14, further including:
  a third via extending from the second metallization layer into another one of the diffusion barrier layers to a point within the other one of the diffusion barrier layers that is spaced from the metal layers.

16. The IC of claim 14, wherein the composite CTM electrode has a smaller footprint than the composite CBM electrode.

17. The IC of claim 14, wherein the diffusion barrier layers are tantalum nitride (TaN) or niobium nitride (NbN).

18. The IC of claim 14, further including:
  a bottom electrode hard mask covering the composite CTM electrode and the dielectric layer, wherein the bottom electrode hard mask has outermost sidewalls aligned respectively to outermost sidewalls of the composite CBM electrode, and wherein the bottom electrode hard mask contacts a top surface of the dielectric layer.

19. The IC according to claim 18, further comprising:
  a top electrode hard mask covering the composite CTM electrode, wherein the bottom electrode hard mask covers the top electrode hard mask and laterally contacts sidewalls of the top electrode hard mask.

* * * * *